United States Patent
Filippov et al.

(10) Patent No.: US 10,922,454 B2
(45) Date of Patent: Feb. 16, 2021

(54) METHOD AND APPARATUS FOR FAST ECONOMIC ANALYSIS OF PRODUCTION OF FRACTURE-STIMULATED WELLS

(71) Applicant: Landmark Graphics Corporation, Houston, TX (US)

(72) Inventors: Andrey Filippov, Houston, TX (US); Xinli Jia, Sugar Land, TX (US); Vitaly Khoriakov, Calgary (CA)

(73) Assignee: Landmark Graphics Corporation, Houston, TX (US)

( * ) Notice: Subject to any disclaimer, the term of this patent is extended or adjusted under 35 U.S.C. 154(b) by 300 days.

(21) Appl. No.: 15/758,575

(22) PCT Filed: Nov. 2, 2015

(86) PCT No.: PCT/US2015/058624
§ 371 (c)(1),
(2) Date: Mar. 8, 2018

(87) PCT Pub. No.: WO2017/078671
PCT Pub. Date: May 11, 2017

(65) Prior Publication Data
US 2018/0253519 A1 Sep. 6, 2018

(51) Int. Cl.
*G06F 30/22* (2020.01)
*E21B 43/26* (2006.01)
*G01V 99/00* (2009.01)

(52) U.S. Cl.
CPC ............. *G06F 30/22* (2020.01); *E21B 43/26* (2013.01); *G01V 99/005* (2013.01); *G01V 2210/624* (2013.01); *G01V 2210/64* (2013.01)

(58) Field of Classification Search
CPC ....... G06F 30/22; E21B 43/26; G01V 99/005; G01V 2210/624; G01V 2210/64
(Continued)

(56) References Cited

U.S. PATENT DOCUMENTS

2002/0013687 A1* 1/2002 Ortoleva ................ G01V 11/00
703/10
2006/0015310 A1 1/2006 Husen et al.
(Continued)

OTHER PUBLICATIONS

Suprapto Soemardan et. al., Production Optimization for Plan of Gas Field Development Using Marginal Cost Analysis, Makara Seri Teknologi, 2013, 17(2): 94-102. (Year: 2013).*
(Continued)

*Primary Examiner* — Justin C Mikowski
(74) *Attorney, Agent, or Firm* — Haynes and Boone, LLP

(57) ABSTRACT

Methods and systems are presented in this disclosure for performing fast economic analysis of production by fracture-stimulated wells. A class of models can be defined by combining a simulated fracture geometry comprising a stimulated reservoir volume with accounting for fluid dynamics and phase transitions in the stimulated reservoir volume for modeling production in a plurality of reservoirs. An objective function related to the production in the plurality of reservoirs can be generated based on at least one model from the class of models. Parameters related to fracture stages of a fracture network can be then determined, based on the objective function, and communicated, via a computer network to a computing device, to be used for at least one of building or operating the fracture network in the reservoir.

18 Claims, 8 Drawing Sheets

(58) Field of Classification Search
USPC .......................................................... 703/10
See application file for complete search history.

(56) References Cited

U.S. PATENT DOCUMENTS

| | | |
|---|---|---|
| 2008/0209997 A1 | 9/2008 | Bailley et al. |
| 2011/0208499 A1* | 8/2011 | Verscheure ............ G01V 11/00 703/10 |
| 2012/0239363 A1 | 9/2012 | Durrani et al. |
| 2012/0318500 A1* | 12/2012 | Urbancic ................ G01V 1/288 166/250.1 |
| 2013/0073268 A1 | 3/2013 | Abacioglu et al. |
| 2013/0140031 A1 | 6/2013 | Cohen et al. |
| 2013/0211807 A1 | 8/2013 | Templeton-Barrett et al. |
| 2013/0238304 A1* | 9/2013 | Glinsky ............... G01V 99/005 703/6 |
| 2014/0151035 A1* | 6/2014 | Cohen .................... E21B 43/12 166/250.15 |
| 2014/0182841 A1* | 7/2014 | Lecerf .................... E21B 43/26 166/250.01 |

OTHER PUBLICATIONS

International Search Report and the Written Opinion of the International Search Authority, or the Declaration, dated Aug. 16, 2016, PCT/US2015/058624, 12 pages, ISA/KR.
Niederreiter, H., "Random Number Generation and Quasi-Monte Carlo Methods", CBMS NSF Regional Conference Series in Applied Mathematics, 1992.
Nocedal et al. "Numerical Optimization (2nd ed.)", 2006, Berlin, New York: Springer-Verlag.
Search Report issued for European Patent Application No. 15907920.1 dated Jul. 24, 2019, 9 pages.
Examination Report issued for European Patent Application No. 15907920.1, dated Apr. 17, 2020, 8 pages.
Orangi et al., "Unconventional Shale Oil and Gas-Condensate Reservoir Production, Impact of Rock, Fluid, and Hydraulic Fractures," *Society of Petroleum Engineers Hydraulic Fracturing Technology Conference and Exhibition*, Jan. 24-26, 2011, The Woodlands, Texas, USA.

* cited by examiner

METHOD AND APPARATUS FOR FAST ECONOMIC ANALYSIS OF PRODUCTION OF FRACTURE-STIMULATED WELLS

PRIORITY

The present application is a U.S. National Stage patent application of International Patent Application No. PCT/US2015/058624, filed on Nov. 2, 2015, the benefit of which is claimed and the disclosure of which is incorporated herein by reference in its entirety.

TECHNICAL FIELD

The present disclosure generally relates to wellbore and reservoir simulations and, more particularly, to a method and apparatus for fast economic analysis of production of fracture-stimulated wells.

BACKGROUND

Gas production from fractured reservoir formations can be very prolific, despite the extremely low matrix permeability that may be encountered. Knowledge of production limitations can be important for operators who drill into very tight reservoirs. In order to quantify production, the interaction between flowing hydrocarbons and water with reservoir matrix and fractures should be well understood. In condensate reservoirs, where gas-liquid phase transition can significantly reduce production rates, the situation is even more complex.

Traditional approaches to productivity assessments of fractured reservoirs include employing a detailed three-dimensional (3D) reservoir model with detailed fracture network geometry obtained from separate mechanical modeling and/or field observations using microseismic devices, and employing simplified analytical and semi-analytical reservoir models. The detailed 3D reservoir analysis is both time-consuming and resource-consuming, and requires highly qualified personnel to run. On the other hand, the simplified analytical equations and reservoir models are not applicable for evaluating the condensate field production. Simplified interfaces for 3D reservoir simulators can handle the optimization problems reasonably fast, but require coupling of wellbore simulators with full versions of 3D solvers, which need to be installed and supported on corresponding platforms. On the other hand, the optimization and economics analyses for multistage wells or wells with advanced completions can be addressed by developing corresponding modules inside the wellbore simulators.

BRIEF DESCRIPTION OF THE DRAWINGS

Various embodiments of the present disclosure will be understood more fully from the detailed description given below and from the accompanying drawings of various embodiments of the disclosure. In the drawings, like reference numbers may indicate identical or functionally similar elements.

DETAILED DESCRIPTION

Figure 1:
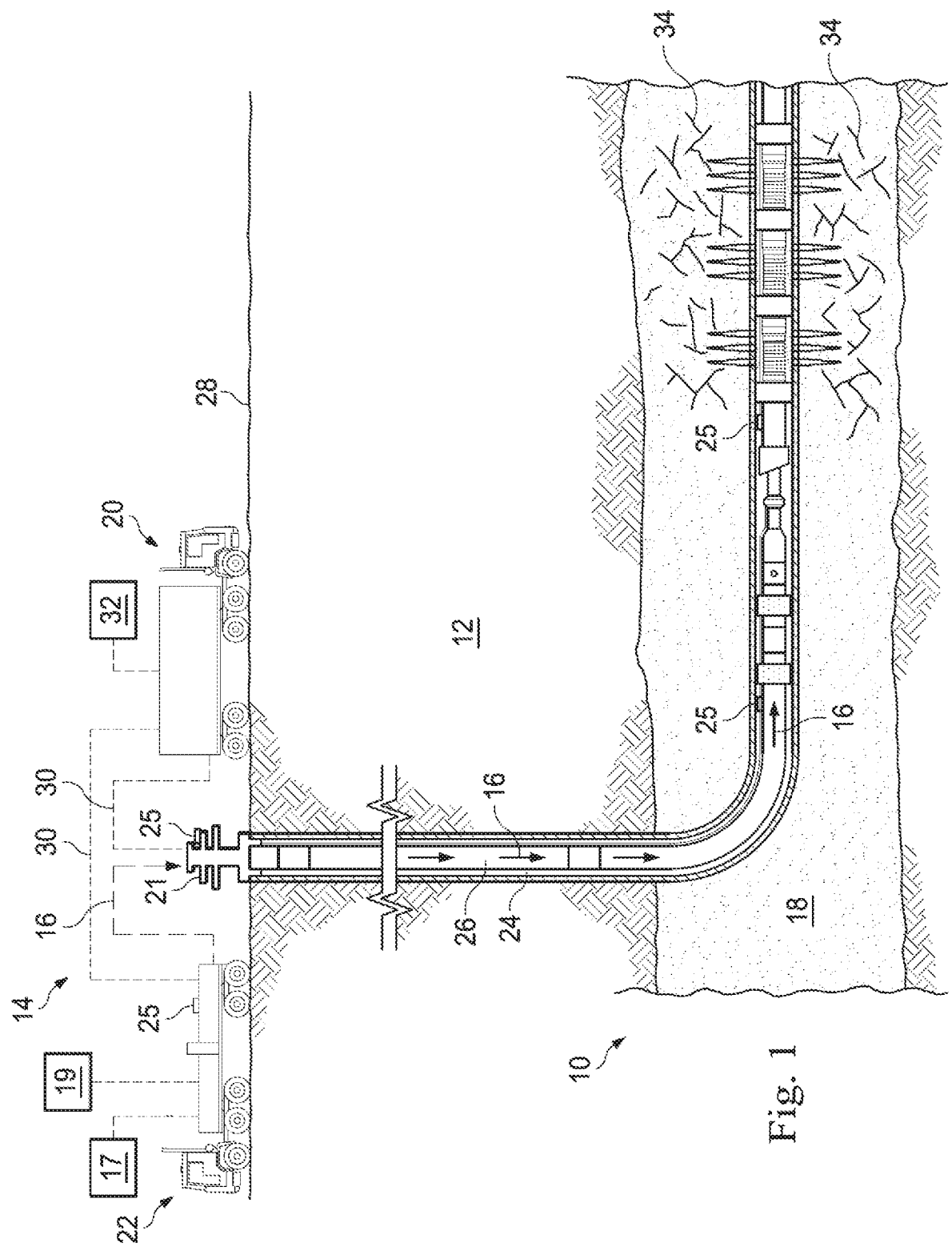
FIG. 1 is a diagram of an example well fracturing system for hydraulic fracturing in a subterranean reservoir formation, according to certain embodiments of the present disclosure.

Embodiments of the present disclosure relate to a method and apparatus for fast and accurate economic analysis of production by fracture-stimulated wells. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one ordinarily skilled in the art to implement such feature, structure, or characteristic in connection with other embodiments whether or not explicitly described. It would also be apparent to one ordinarily skilled in the relevant art that the embodiments, as described herein, can be implemented in many different embodiments of software, hardware, firmware, and/or the entities illustrated in the Figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

The disclosure may repeat reference numerals and/or letters in the various examples or Figures. This repetition is for the purpose of simplicity and clarity and does not in itself dictate a relationship between the various embodiments and/or configurations discussed. Further, spatially relative terms, such as beneath, below, lower, above, upper, uphole, downhole, upstream, downstream, and the like, may be used herein for ease of description to describe one element or feature's relationship to another element(s) or feature(s) as illustrated, the upward direction being toward the top of the corresponding Figure and the downward direction being toward the bottom of the corresponding Figure, the uphole direction being toward the surface of the wellbore, the downhole direction being toward the toe of the wellbore. Unless otherwise stated, the spatially relative terms are intended to encompass different orientations of the apparatus in use or operation in addition to the orientation depicted in the Figures. For example, if an apparatus in the Figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Moreover even though a Figure may depict a horizontal wellbore or a vertical wellbore, unless indicated otherwise, it should be understood by those ordinarily skilled in the art that the apparatus according to the present disclosure is equally well suited for use in wellbores having other orientations including vertical wellbores, slanted wellbores, multilateral wellbores or the like. Likewise, unless otherwise noted, even though a Figure may depict an offshore operation, it should be understood by those ordinarily skilled in the art that the apparatus according to the present disclosure is equally well suited for use in onshore operations and vice-versa. Further, unless otherwise noted, even though a Figure may depict a cased hole, it should be understood by those ordinarily skilled in the art that the apparatus according to the present disclosure is equally well suited for use in open hole operations.

Illustrative embodiments and related methods of the present disclosure are described below in reference to FIGS. 1-10 as they might be employed for fast economic analysis of production by fracture-stimulated wells. Such embodiments and related methods may be practiced, for example, using a computer system as described herein. Other features and advantages of the disclosed embodiments will be or will become apparent to one of ordinary skill in the art upon examination of the following Figures and detailed description. It is intended that all such additional features and advantages be included within the scope of the disclosed embodiments. Further, the illustrated Figures are only exemplary and are not intended to assert or imply any limitation with regard to the environment, architecture, design, or process in which different embodiments may be implemented.

Embodiments of the present disclosure relate to using a specific class of near-wellbore models for fast and accurate economic analysis of fracture-stimulated wells. The economic analysis presented in this disclosure may result in practical suggestions for fracture parameters, including, but not limited to, a number of created fractures, fracture lengths, spacing between fractures, and production time.

FIG. 1 illustrates an example well fracturing system 10 for applying a fracture treatment (e.g., hydraulic fracturing) to a subterranean formation 12, according to certain illustrative embodiments of the present disclosure. Fracture treatments may be used, for example, to form or propagate fractures in a rock layer by injecting pressurized fluid. The fracture treatment may enhance or otherwise influence production of petroleum, natural gas, coal seam gas, or other types of reservoir resources. The example well fracturing system 10 includes a reservoir 18 in the subterranean formation 12 and an injection system 14 that applies fracturing fluid 16 from a fracturing fluid source 17 to the reservoir 18. In one or more embodiments, the reservoir 18 may be a condensate reservoir with fracture-stimulated production. The condensate reservoir 18 may feature phase transition of reservoir deposits between oil and gas, gas condensation and water flow.

The injection system 14 illustrated in FIG. 1 includes control trucks 20, pump trucks 22, a wellbore 24, a working string 26 and other equipment. In the example shown in FIG. 1, the pump trucks 22, the control trucks 20 and other related equipment are above the surface 28, and the wellbore 24, the working string 26, and other equipment are beneath the surface 28. An injection system can be configured as shown in FIG. 1 or in a different manner, and may include additional or different features as appropriate. The injection system 14 may be deployed in any suitable environment, for example, via skid equipment, a marine vessel, sub-sea deployed equipment, or other types of equipment.

The wellbore 24 can include both vertical and horizontal sections, such as shown in FIG. 1, and the fracturing fluid 16 is applied to the reservoir 18, which resides near the wellbore 24. Generally, a wellbore may include horizontal, vertical, slant, curved, and other types of wellbore geometries and orientations, and the fracture treatment (e.g., hydraulic fracturing) may generally be applied to any portion of the subterranean formation 12. The wellbore 24 can include a casing that is cemented or otherwise secured to the wellbore wall. The wellbore 24 can be uncased or include uncased sections. Perforations can be formed in the casing to allow fracturing fluids and/or other materials to flow into the reservoir 18. Perforations can be formed using shape charges, a perforating gun, and/or other tools.

The pump trucks 22 may include mobile vehicles, immobile installations, skids, hoses, tubes, fluid tanks or reservoirs, blenders, pumps, valves, and/or other suitable structures and equipment. The pump trucks 22 can communicate with the control trucks 20, for example, by a communication link 30. The pump trucks 22 are coupled via a wellhead 21 to the working string 26 to communicate the fracturing fluid 16 into the wellbore 24. The working string 26 may include coiled tubing, sectioned pipe, and/or other structures that communicate fluid through the wellbore 24. The working string 26 can include flow control devices, bypass valves, ports, and or other tools or well devices that control the flow of fluid from the interior of the working string 26 into the reservoir 18.

The fracturing fluid 16 can include any appropriate fluid or fluid composition. For example, the fracturing fluid 16 can include hydraulic fracturing fluids, chemical treatment fluids, and other types of fluids. The fracturing fluid 16 may include proppant-laden fluids, thin fluids, gels, foams, additives, water, slurry, liquids, gases or any suitable combination. The fracturing fluid 16 may generally include fluids injected for applying fracture treatments, chemical treatments, heat treatments, or any suitable combination of these and other fluids. For illustrative purposes only a proppant source 19 is shown in flow communication with pump truck 22.

The control trucks 20 can include mobile vehicles, immobile installations, and/or other suitable structures. Control truck 20 may be integrated with pump truck 22, and may be coupled to the wellhead 21. The control trucks 20 can control and/or monitor the injection treatment. For example, the control trucks 20 may include communication links 30 that allow the control trucks 20 to communicate with tools, sensors, and/or other devices installed in the wellbore 24 or at the surface, such as sensors 25. The control trucks 20 may receive data from, or otherwise communicate with, a computing system 32 that models one or more aspects of the fracture treatment. In addition, the control trucks 20 may include communication links that allow the control trucks 20 to communicate with the pump trucks 22 and/or other systems. The control trucks 20 may include an injection control system that controls the flow of the fracturing fluid 16 into the reservoir 18. For example, the control trucks 20 may monitor and/or control the density, volume, flow rate, flow pressure, location, proppant, flowback and/or other properties of the fracturing fluid 16 injected into the reservoir 18.

The reservoir 18 can include a fracture network 34, as shown in FIG. 1. Some or all of the fracture network 34 can be selected for analysis by the computing system 32. For example, given an area (e.g., surrounding the wellbore 24), a subset of the area (e.g., defined by a selected width, depth, and length) or all of the area can be modeled by the computing system 32.

In one aspect of operation, the injection system 14 applies a fracture treatment to the reservoir 18. The control truck 20 controls and monitors the pump truck 22, which pumps the fracturing fluid 16 through the work string 26, into the wellbore 24, and subsequently into the reservoir 18. The fracturing fluid 16 can be injected at a pressure that fractures the reservoir media in the reservoir 18. Some aspects of the fracture treatment may be selected, tuned, or otherwise parameterized based on information provided by the computing system 32, in real time or based on prior treatments (e.g., prior treatments in similar settings, etc.).

Certain embodiments of the present disclosure relate to developing a model by considering a simplified geometry of a fracture network (e.g., the fracture network 34), but with detailed accounting for multiphase fluid dynamics that efficiently predicts pressure depletion and production decline. The effectiveness of such reservoir model can allow using the developed reservoir model as an application to existing wellbore simulators, eliminating the need to combine the wellbore simulators with a detailed three-dimensional (3D) reservoir simulator when a fast parametric and/or sensitivity analysis is required. More than one such reservoir model (i.e., a class of reservoir models) can be developed, based on different physical and numerical approaches. In the present disclosure, the developed class of reservoir models may be utilized for fast and accurate economic analysis of production by fracture-stimulated wells, resulting in practical suggestions for fracture parameters, including, but not limited to, the number of created fractures, fracture lengths, spacing between fractures and production time.

Embodiments of the present disclosure relate to creating an efficient numerical model for a reservoir formation, based on simplified parallel-planes geometry of a fracture network and utilization of a three-phase flow transient analysis of pressure distribution in an extended stimulated domain with account for gas condensation and water flow. Since the reservoir model developed herein enables phase transition between oil and gas, the banking effect (i.e., production reduction attributable to gas condensation) can be efficiently identified and analyzed by applying embodiments of the present disclosure. In one or more embodiments, the reservoir model presented in this disclosure can be applied for sensitivity analysis of reservoir productivity regarding changes of fracture size and spacing, as well as reservoir permeability. For the economic analysis of production by fracture-stimulated wells, an objective function accounting for cost of fracture unit length, operating costs, and condensate market price is built herein based on the reservoir model and utilized for one-, two- and three-parametric (e.g., multi-parametric) optimization of the fracture production layout.

Figure 2:
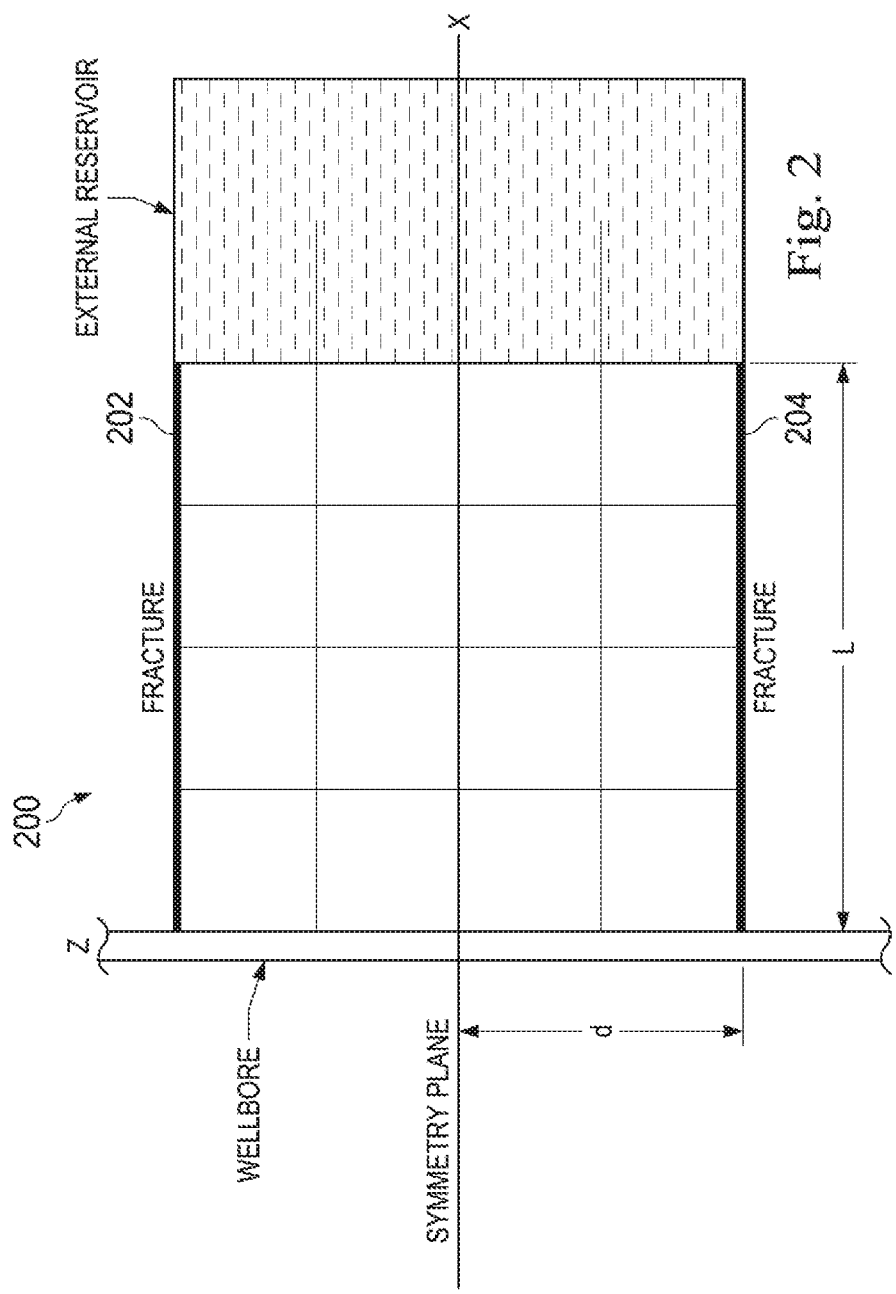
FIG. 2 is a schematic illustrating geometry of a model related to fracture-stimulated production, according to certain embodiments of the present disclosure.

FIG. 2 is a schematic illustrating geometry 200 of a model related to production by fracture-stimulated wells (e.g., the reservoir 18 with the fracture network 34 of the well fracturing system 10 illustrated in FIG. 1), according to certain illustrative embodiments of the present disclosure. For some embodiments, the fracture production model may be designed considering a fracture network with planar fractures, parallel to each other and identical. As illustrated in FIG. 2, each fracture in the fracture network may be of length L and height H, with spacing 2d between two adjacent fractures (e.g., fractures 202 and 204 illustrated in FIG. 2), wherein a fracture stage with length $L_f$ contains $L_f/2d$ fractures.

In order to simulate fracture-stimulated production, the mathematical (numerical) model can be developed based on the mass balance equations for condensate and water, i.e., $$\frac{\partial \rho_\alpha S_\alpha \varphi}{\partial t} + div(\rho_\alpha u_\alpha) = q_\alpha, \quad (1)$$

$$u_\alpha = -\frac{k_\alpha}{\mu_\alpha} \nabla p_\alpha; \alpha = g, o,$$

where $\alpha$ is an index of the component (e.g., oil, gas, water), $S_\alpha$ is a component saturation, $\varphi$ is a formation porosity, $\rho_\alpha$ is a component density, $k_\alpha$ and $\mu_\alpha$ are component permeability and viscosity, respectively, $q_\alpha$ is a generation rate for a component due to phase transition, $u_\alpha$ is a vector of component flow rate, and $p_\alpha$ is a component pressure.

Figure 3:
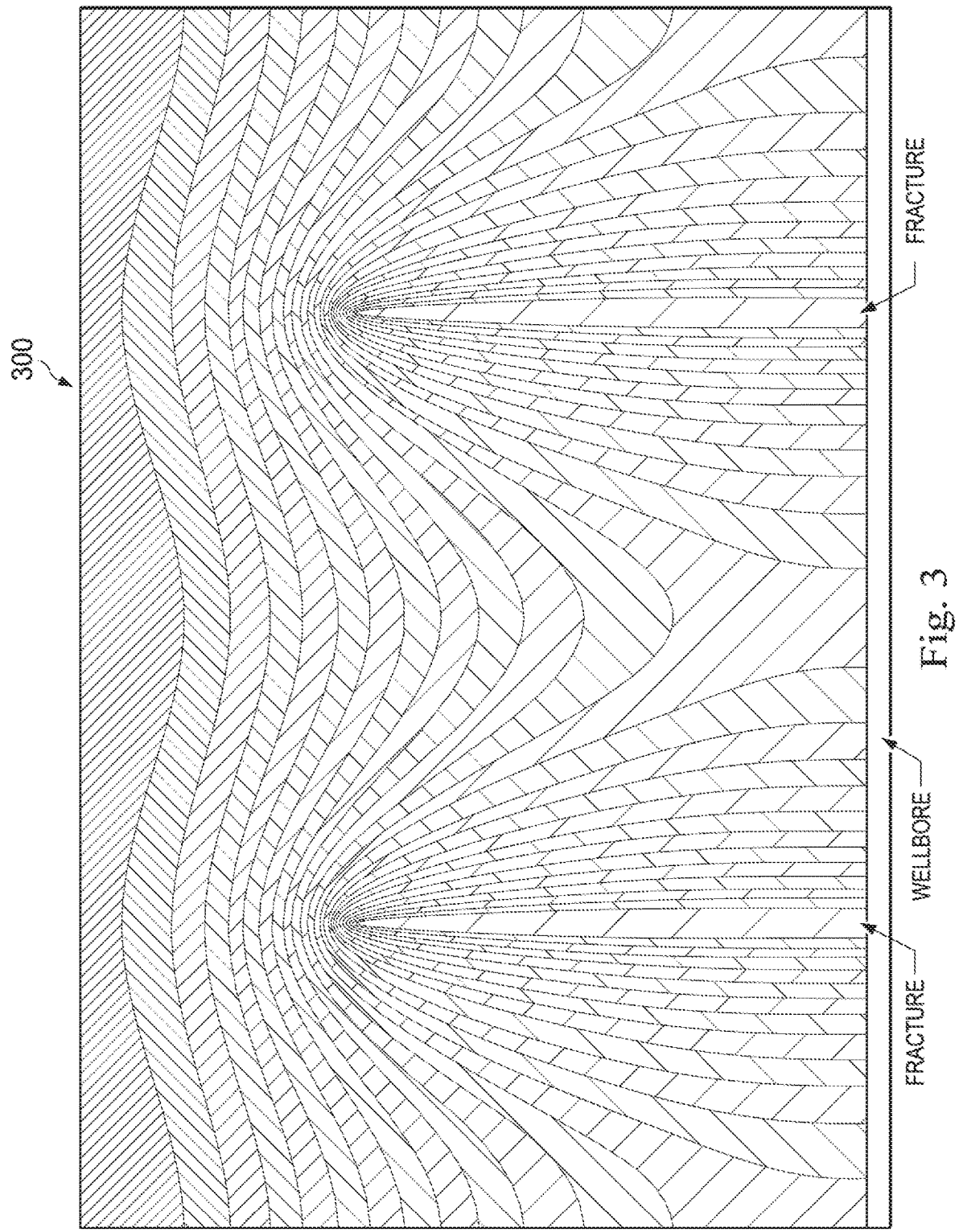
FIG. 3 is a graph illustrating pressure distribution in a vicinity of two fractures in a reservoir formation, according to certain embodiments of the present disclosure.

In one or more embodiments, the condensate-gas equilibrium ratio can be calculated using the pressure-volume-temperature (PVT) data tables, depending on the composition of the hydrocarbon phase in the reservoir formation. Transient equations (1) can be discretized using, for example, the finite differences and solved using, for example, the Alternating Directions Implicit (ADI) method. FIG. 3 illustrates a graph 300 showing calculated pressure distribution in the vicinity of two fractures (e.g., the fractures 202 and 204 illustrated in FIG. 2) near a wellbore in a reservoir formation, according to certain illustrative embodiments of the present disclosure. Different shades in FIG. 3 denote various pressure levels around the fractures, wherein the pressure is at a lowest level in immediate vicinity of the fractures and increases in the reservoir formation further from the fractures.

Certain embodiments of the present disclosure utilize combination of simple, but representative geometry and detailed accounting for mass transport and physical properties, which allows for fast and rigorous calculations of production depletion in a wellbore and phase transition in the near well reservoir. The model of fracture-stimulated production presented herein may further provide prediction of the so-called banking effect, when the condensation of liquid phase from the gas results in a significant decrease in the production rate.

For certain embodiments of the present disclosure, the objective function for a fracture stage having the length $L_f$ and comprising $L_f/2d$ fractures can be postulated as:

$$F = \frac{L_f}{2d}[gQ(L, d, t) - f(L)] - tC, \qquad (2)$$

where t is time, g is the price of unit mass of condensate, $f$ is the cost of building a fracture, Q is the cumulative production function that may be derived based on the model of fracture-stimulated production defined by equations (1), and C is the operating cost of the stage per unit time. In one or more embodiments, optimization of the fracture system can be realized by finding local and/or global maximum of the objective function F defined by equation (2), as discussed in more details below.

For the illustrative purpose only, it can be assumed that the reservoir permeability is equal to $10^{-4}$ D [Darcy], the reservoir porosity is 10%, the price of condensate is $500 per metric ton, the operating cost for a fracture stage is $10,000/year, and the cost of making a fracture is a linear function of a fracture length. Then, the cost of making a fracture of length L may be given as:

$$f(L) = 3.279 \cdot 10^4 L + 7.5 \cdot 10^4. \qquad (3)$$

All calculations presented in this disclosure are conducted for a fracture stage $L_f$ having a fixed total length of 100 meters.

Figure 4:
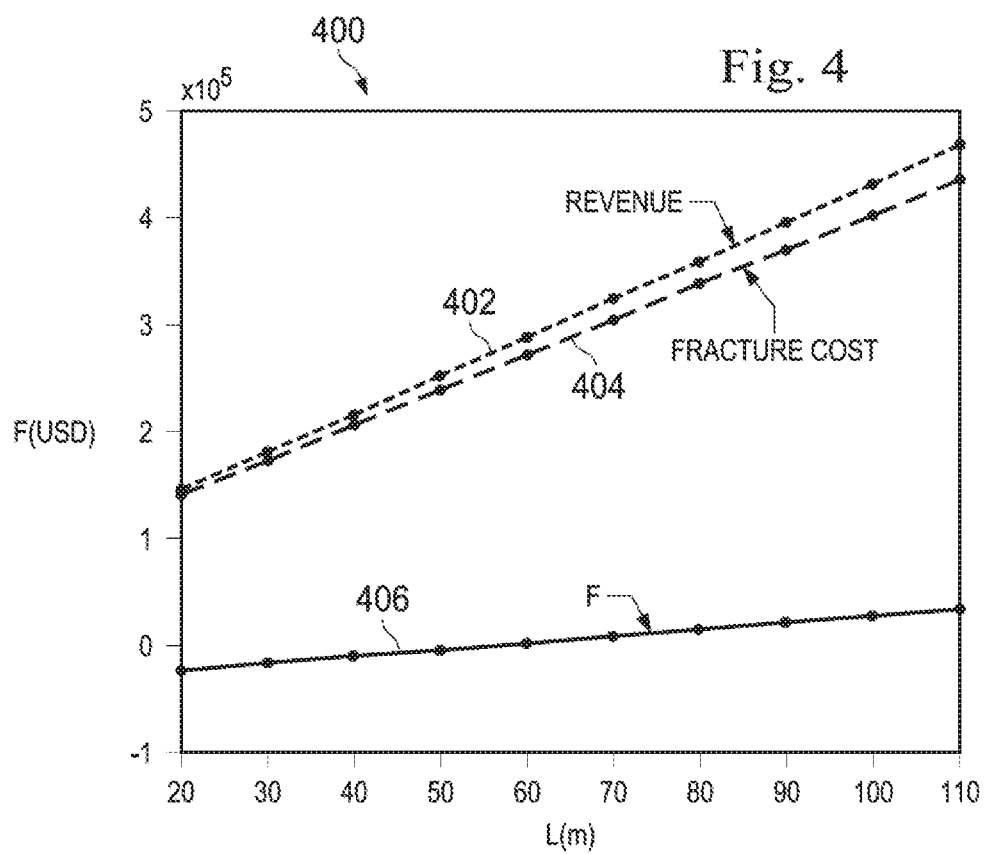
FIG. 4 is a graph illustrating potential revenue, fracture cost and objective function as functions of a fracture length, according to certain embodiments of the present disclosure.

For certain embodiments of the present disclosure, the objective function defined by equation (2) may be optimized (e.g., a local or global maximum of the objective function can be found) by applying one-dimensional (1D) optimization for determining a fracture length such that production from the fracture stage is at a preferred (optimal) level. For example, the spacing between fractures 2d can be fixed at 60 meters, and the fracture length can be varied between 10 meters and 110 meters, while the production time is set to two years. FIG. 4 is a graph 400 illustrating potential revenue (plot 402), fracture cost (plot 404) and objective function (plot 406) as functions of a fracture length, according to certain illustrative embodiments of the present disclosure. As illustrated in FIG. 4, the unit of fracture length is in meters and the unit of potential revenue, fracture cost and objective function is in U.S. dollars.

Plot 402 in FIG. 4 represents the potential revenue or the price of produced condensate as a function of fracture length, i.e., the cumulative production function Q from equation (2) that depends only on a fracture length L since fracture spacing and production time are fixed. Plot 404 in FIG. 4 represents the cost of making a fracture as a function of fracture length, i.e., the function $f$ defined in equations (2) and (3). Plot 406 in FIG. 4 represents the objective function F as a function of fracture length defined by equation (2). It can be observed from plot 406 in FIG. 4 that the objective function F switches from negative values to positive values for the fracture length of approximately 60 meters. This may indicate that the production from the fracture stage can be economic for long enough fractures, i.e., for fractures having lengths greater than 60 meters.

For certain embodiments of the present disclosure, the objective function defined by equation (2) may be optimized (e.g., a local or global maximum of the objective function can be found) by applying one-dimensional (1D) optimization for determining a fracture spacing such that production from the fracture stage is at a preferred (optimal) level. For example, the fracture length can be fixed at 100 meters, and the fracture spacing can be varied between 40 meters and 150 meters, while the production time is set to two years.

Figure 5:
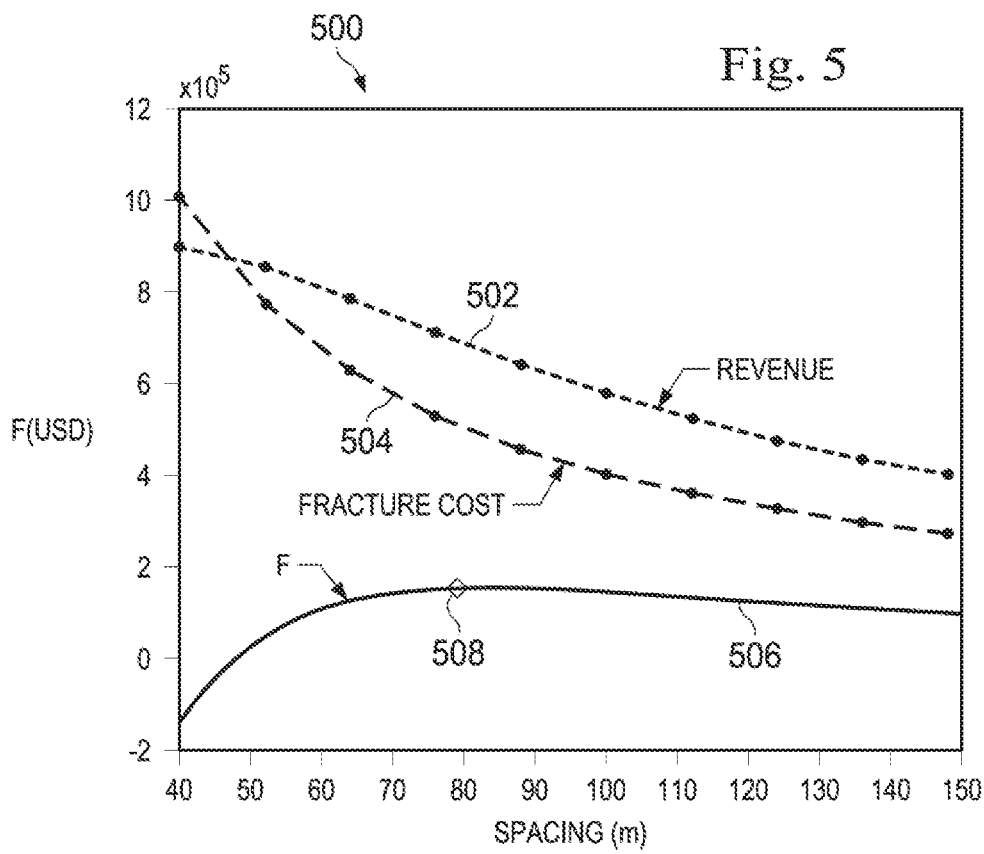
FIG. 5 is a graph illustrating potential revenue, fracture cost and objective function as functions of a fracture spacing, according to certain embodiments of the present disclosure.

FIG. 5 is a graph 500 illustrating potential revenue (plot 502), fracture cost (plot 504) and objective function (plot 506) as functions of a fracture spacing, according to certain illustrative embodiments of the present disclosure. Plot 502 in FIG. 5 represents the potential revenue or the price of produced condensate as a function of fracture spacing, i.e., the cumulative production function Q from equation (2) that depends only on a fracture spacing since fracture length and production time are fixed. Plot 504 in FIG. 5 represents the cost of making a fracture as a function of fracture spacing, i.e., the function $f$ defined in equations (2) and (3). Plot 506 in FIG. 5 represents the objective function F as a function of fracture spacing defined by equation (2). Increase of the fracture spacing may result in a lower number of fractures and lower production and revenue, while decrease of the fracture spacing below the optimal spacing may result in increase in number of fractures in the stage and fast growth of associated total fracturing costs. Therefore, the objective function represented by plot 506 in FIG. 5 is not a monotone function of the fracture spacing (e.g., as in FIG. 4), and has a maximum corresponding to the optimal fracture spacing, as shown in FIG. 5 by point 508 that corresponds to the fracture spacing of approximately 80 meters.

In fracture design, several parameters are typically optimized in the same time in order to achieve the preferred (optimal) level of production. For certain embodiments of the present disclosure, the objective function defined by equation (2) may be optimized (e.g., a local or global maximum of the objective function can be found) by applying two-dimensional (2D) optimization for determining both a fracture length and a spacing between the fractures such that production from the fracture stage is at a preferred (optimal) level. In the illustrative case, the optimal combination of fracture length and fracture spacing can be found by calculating the cumulative production (i.e., the function Q defined in equation (2)) with fracture spacing 2d varying in the interval of 40 meters<2d<200 meters and the fracture length L varying in the interval 30 meters<L<120 meters.

Figure 6:
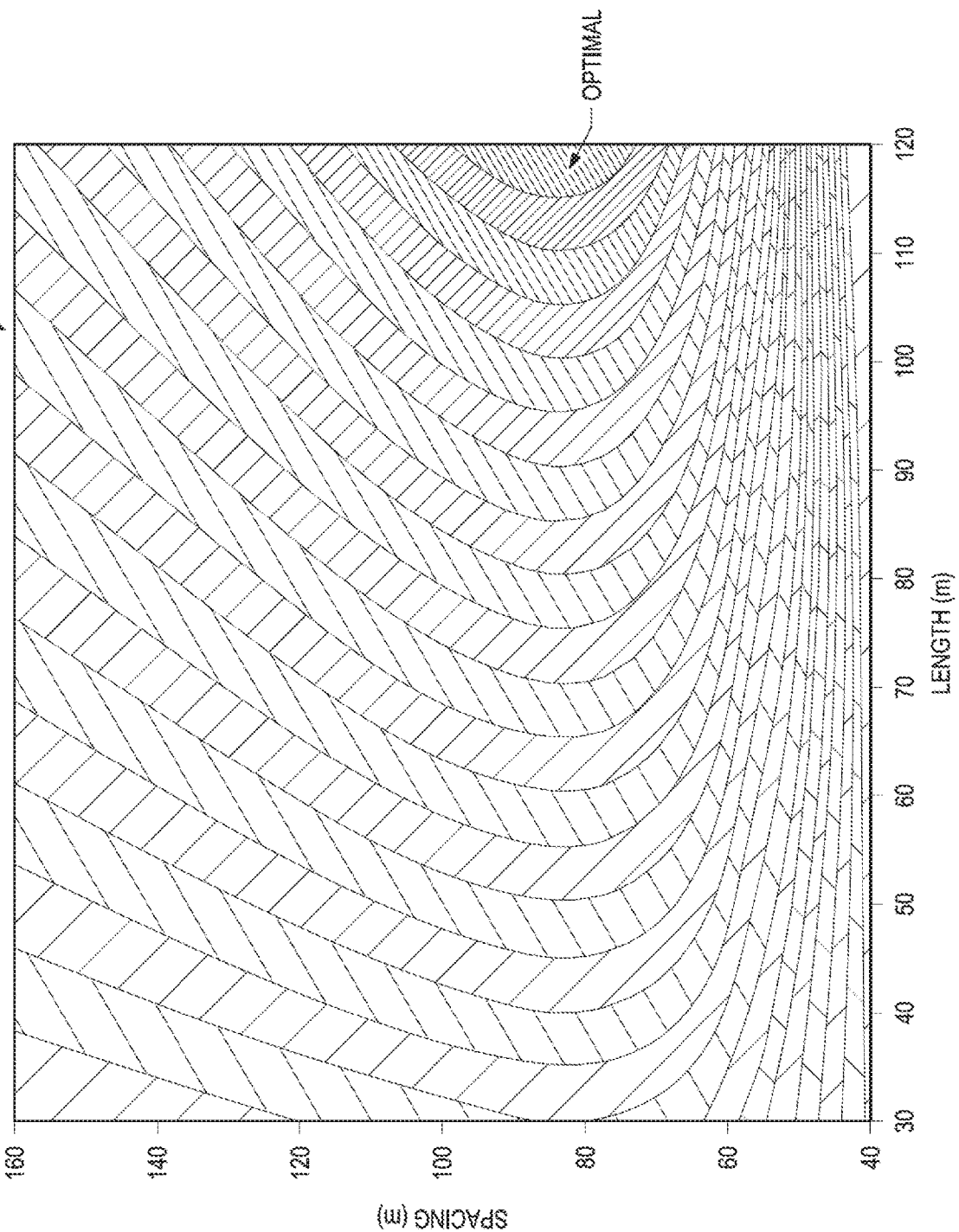
FIG. 6 is a graph illustrating two-dimensional (2D) objective function profile as a function of fracture spacing and fracture length, according to certain embodiments of the present disclosure.

FIG. 6 is a graph 600 illustrating 2D objective function profile calculated as a function of fracture spacing and fracture length, according to certain illustrative embodiments of the present disclosure. In FIG. 6, shades with higher intensity indicate higher values of the objective function F. It can be observed from FIG. 6 that the calculated 2D objective function profile has a maximum value for a longest considered fracture length (e.g., the fracture length of 120 meters) and for spacing between fractures of approximately 85 meters. While increase in the fracture length may lead to monotonous increase of the objective function, for any given fracture length there is an optimal value of fracture spacing. Increase of the fracture spacing may result in a lower number of fractures and lower production and revenue, while decrease of the fracture spacing above the optimal fracture spacing may result in an increased number of fractures in a fracture stage (with a fixed total fracture length) and in growth of associated total fracturing costs.

For certain embodiments of the present disclosure, the objective function defined by equation (2) may be optimized (e.g., a global maximum of the objective function can be found) by applying 3D optimization for determining a fracture length, a spacing between the fractures and production time such that production from the fracture stage is at a preferred (optimal) level. For embodiments related to 1D and 2D optimization, it can be possible without using any advanced method to select nodes of structured grid in the parametric space as test points for finding the optimal set of fracture parameters (e.g., fracture length, fracture spacing). However, for embodiments related to fracture optimization with respect to three and more fracture parameters (e.g., fracture length, fracture spacing, production time), the amount of computations and elapsed Central Processing Unit (CPU) time become critical. In one or more embodiments, the test points in the parametric space may be chosen randomly, which helps in reducing the computation time. In one or more other embodiments, utilizing quasi-random numbers such as Halton sequences for choosing the test combinations of parameters may result in even faster process of finding a maximum of the objective function of general kind (with no assumption of smoothness or continuity).

Figure 7:
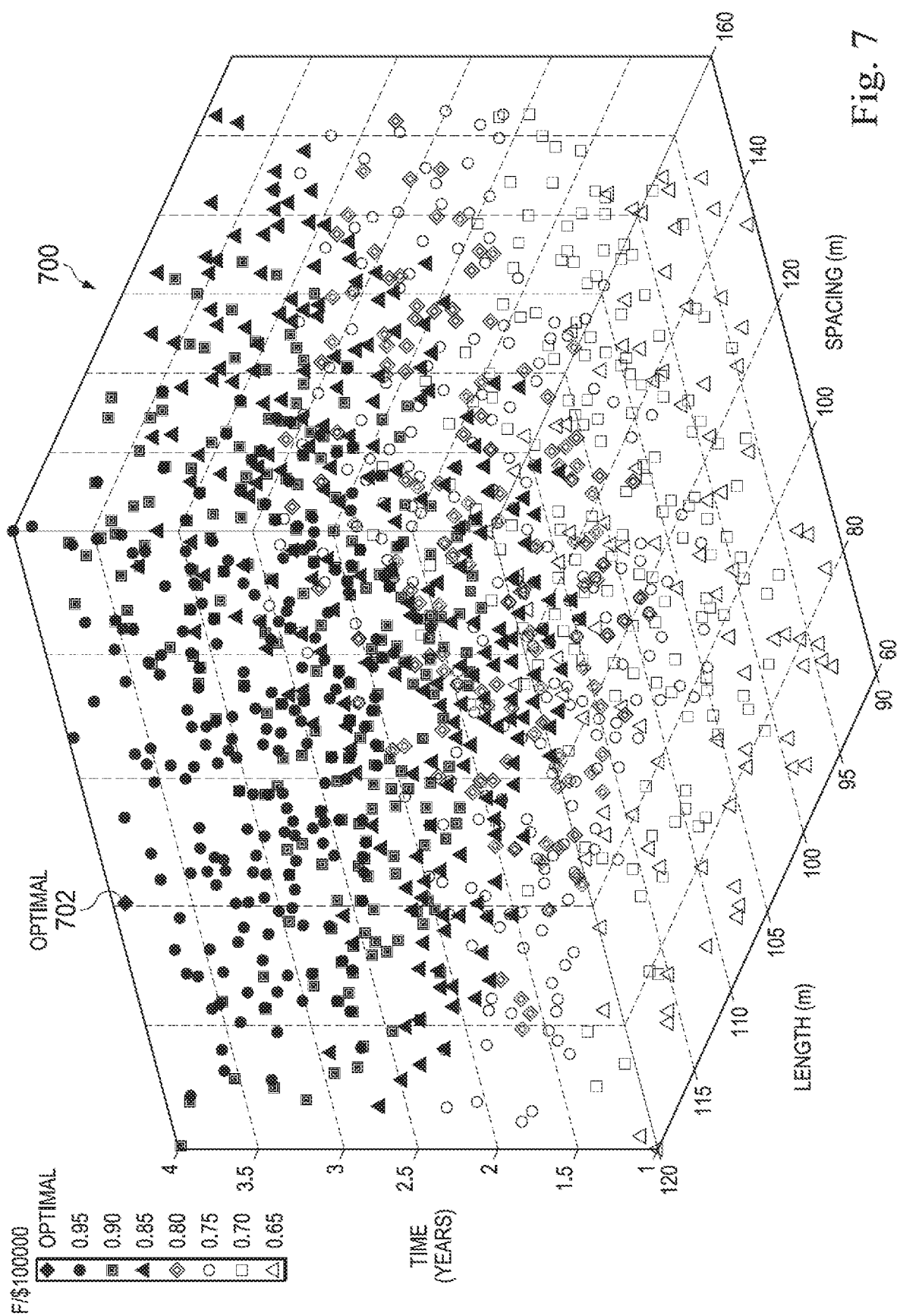
FIG. 7 is a graph illustrating values of an objective function in three-dimensional (3D) space for different combinations of fracture length, fracture spacing and production time parameters, according to certain embodiments of the present disclosure.

The method based on a quasi-random number generator (e.g., based on Monte Carlo or Quasi Monte Carlo techniques) for choosing the parametric test combinations can be applied for optimizing the fracture production parameters (e.g., fracture length, fracture spacing, production time) together with the solver (e.g., wellbore model) for condensate, gas and water distribution. FIG. 7 illustrates a graph 700 showing values of the objective function in 3D space for different combinations of fracture production parameters (e.g., fracture length, fracture spacing and production time), according to certain illustrative embodiments of the present disclosure. The objective function defined by equation (2) is calculated for, for example, approximately 1300 combinations of fracture production parameters, with fracture spacing varying in the interval 40 meters<2d<200 meters, the fracture length varying in the interval 30 meters<L<120 meters, and the production time varying in the interval 1 year<t<5 years. The optimal value of the objective function is represented by point 702 in the 3D parametric space in FIG. 7, defining the optimal values of the fracture production parameters, i.e., fracture length, fracture spacing and production time.

Figure 8:
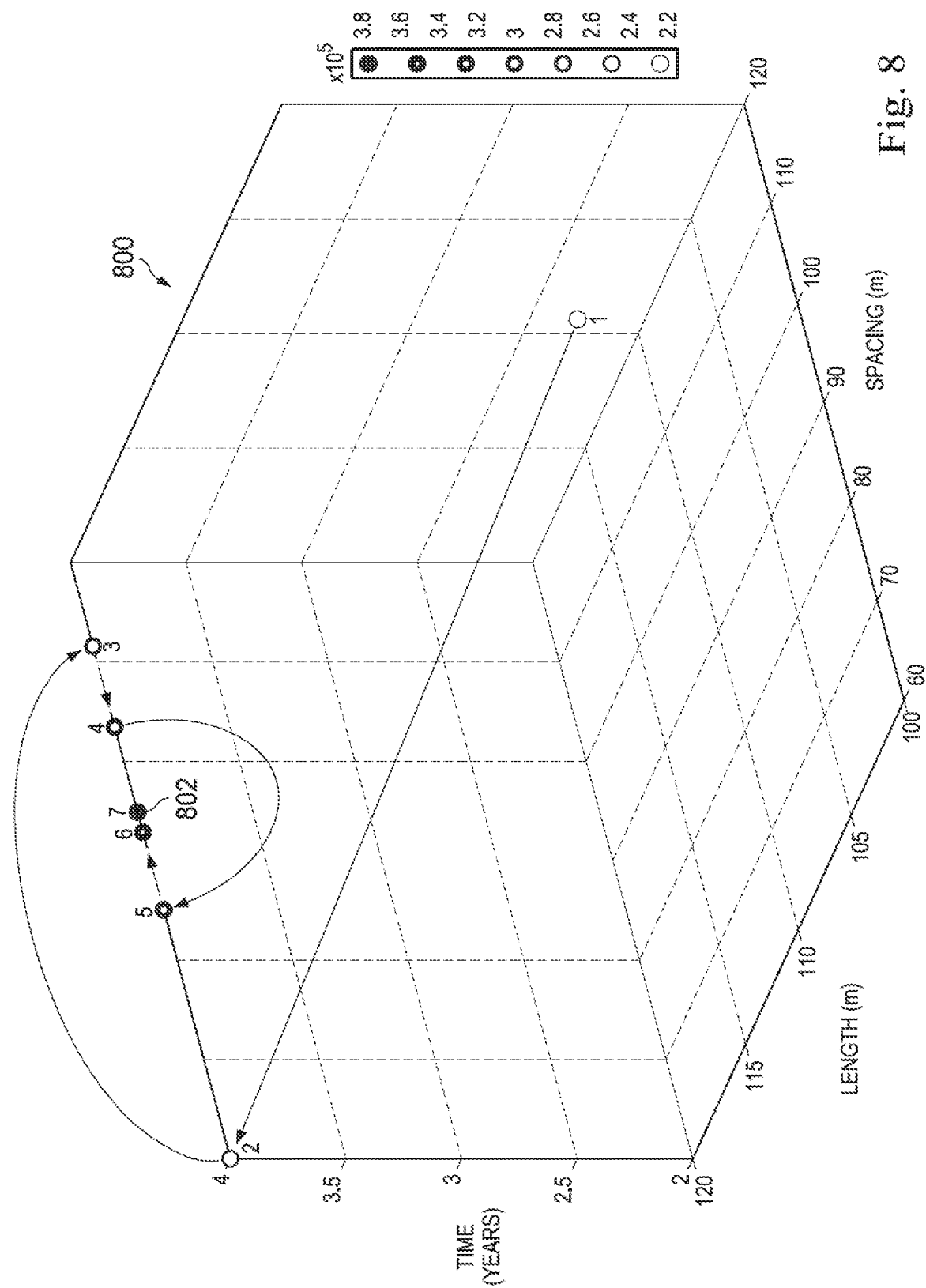
FIG. 8 is a graph illustrating optimization in 3D space of fracture length, fracture spacing and production time parameters, according to certain embodiments of the present disclosure.

In one or more embodiments, if the objective function is smooth, as the one defined by equation (2), instead of Monte Carlo and/or Quasi Monte Carlo techniques, even faster constrained optimization methods (e.g., the Active Set Method) can be employed for choosing combinations of fracture production parameters. For certain embodiments, the optimization of the objective function based on the constrained optimization method for choosing combinations of fracture production parameters may be more accurate and faster than the optimization of the objective function based on Monte Carlo and Quasi Monte Carlo approaches for choosing combinations of fracture production parameters. For example, the optimization of the objective function based on the constrained optimization method may only require 20 to 30 calculations (iterations) of the accumulated production decline curve to converge to a (global) maximum of the objective function. FIG. 8 is a graph 800 illustrating optimization of the objective function in 3D space based on the Active Set Method for choosing combinations of fracture production parameters (e.g., fracture length, fracture spacing and production time), according to certain illustrative embodiments of the present disclosure. FIG. 8 shows last seven iterations (e.g., out of 28 iterations) of the objective function optimization in 3D parametric space, resulting into a maximum of the objective function F equal to $3,932,200, which corresponds to a maximum tested fracture length and production time, and fracture spacing of 92.84 meters, illustrated by point 802 in FIG. 8.

Embodiments of the present disclosure relate to a numerical and mathematical model, based on simplified geometry of the stimulated reservoir volume with detailed account for fluid dynamics and phase transitions for fast modeling of fracture-stimulated production. Certain embodiments of the present disclosure utilize a class of models, characterized by simplified geometry, but with detailed accounting for fluid dynamics and phase transitions for fast optimization of fracture networks for fracture-stimulated production.

Embodiments of the present disclosure relate to using a class of models, characterized by simplified geometry, but with detailed account for fluid dynamics and phase transitions for fast and accurate economic analysis of fracture networks for fracture-stimulated production. In one or more embodiments, Quasi Monte Carlo methods may be applied for optimizing the economic analysis and multi-parametric optimization in fracture-stimulated reservoirs. In one or more other embodiments, combination of the proposed effective fracture production model and powerful constrained optimization algorithm may be used for fast economic analysis and optimization of parameters of the fracture stages.

Figure 9:
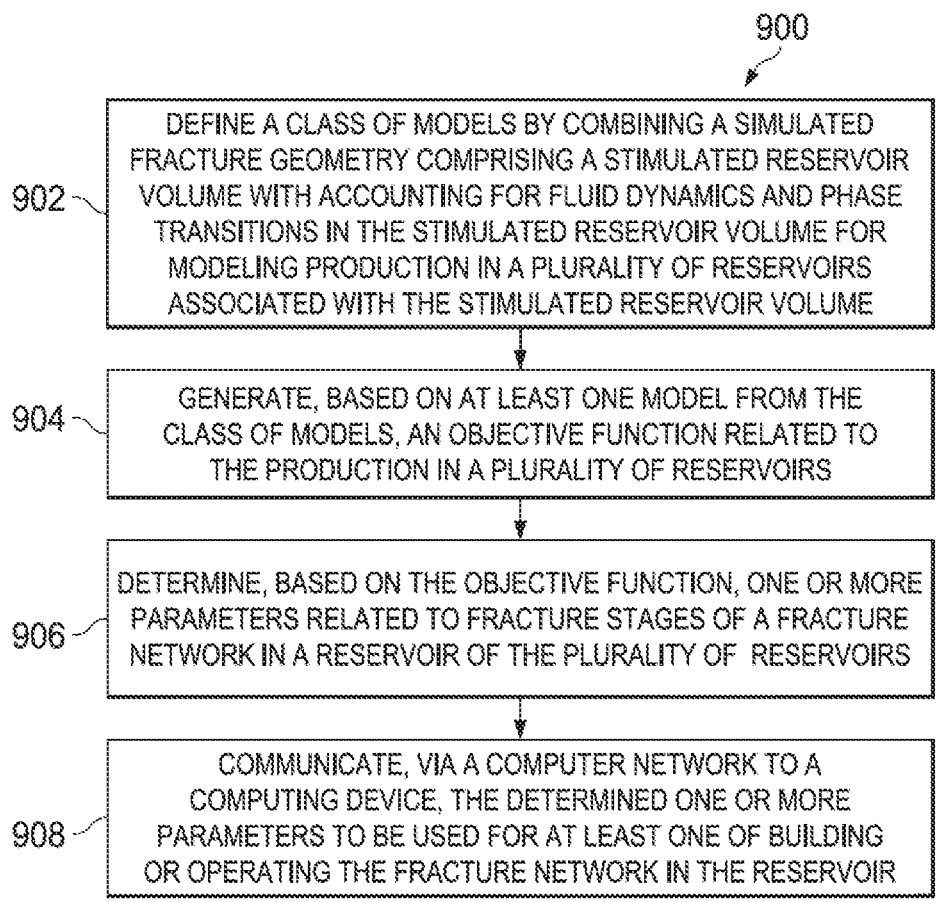
FIG. 9 is a flow chart of a method for performing multi-parametric production optimization in fracture-stimulated reservoirs, according to certain embodiments of the present disclosure.

Discussion of an illustrative method of the present disclosure will now be made with reference to FIG. 9, which is a flow chart 900 of a method for performing multi-parametric production optimization in fracture-stimulated reservoirs, according to certain illustrative embodiments of the present disclosure. In one or more embodiments, the operations of method 900 of FIG. 9 may be performed by a computing system placed on a location remotely from a well site. In one or more other embodiments, the operations of method 900 of FIG. 9 may be performed by a computing system located on a well site (e.g., computing system 32 of well fracturing system 10 illustrated in FIG. 1). The method begins at 902 by defining a class of models by combining a simulated fracture geometry comprising a stimulated reservoir volume with accounting for fluid dynamics and phase transitions in the stimulated reservoir volume for modeling production in a plurality of reservoirs associated with the stimulated reservoir volume. At 904, an objective function (e.g., the objective function defined by equation (2)) related to the production in the plurality of reservoirs may be generated based on at least one model from the class of models. At 906, based on the objective function, the one or more parameters related to fracture stages of a fracture network in a reservoir of the plurality of reservoirs may be determined (e.g., by optimizing the objective function defined by equation (2)). At 908, the determined one or more parameters may be communicated, via a computer network to a computing device (e.g., computing device on a well site, such as computing system 32 of well fracturing system 10 illustrated in FIG. 1), to be used for at least one of building or operating the fracture network in the reservoir.

Figure 10:
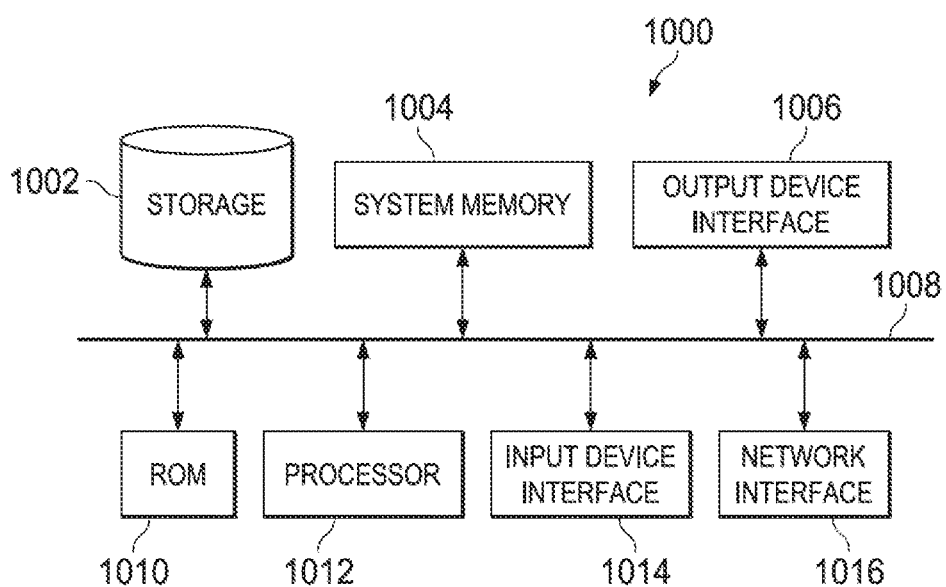
FIG. 10 is a block diagram of an illustrative computer system in which embodiments of the present disclosure may be implemented.

FIG. 10 is a block diagram of an illustrative computing system 1000 (also illustrated in FIG. 1 as computing system 32) in which embodiments of the present disclosure may be implemented adapted for fast and accurate analysis of production by fracture-stimulated wells in reservoirs (e.g., reservoir 18 with fracture network 34 of well fracturing system 10 illustrated in FIG. 1). For example, the operations of method 900 of FIG. 9, as described above, may be implemented using the computing system 1000 (also illustrated in FIG. 1 as computing system 32). The computing system 1000 can be a computer, phone, personal digital assistant (PDA), or any other type of electronic device. Such an electronic device includes various types of computer readable media and interfaces for various other types of computer readable media. As shown in FIG. 10, the computing system 1000 includes a permanent storage device

1002, a system memory 1004, an output device interface 1006, a system communications bus 1008, a read-only memory (ROM) 1010, processing unit(s) 1012, an input device interface 1014, and a network interface 1016.

The bus 1008 collectively represents all system, peripheral, and chipset buses that communicatively connect the numerous internal devices of the computing system 1000. For instance, the bus 1008 communicatively connects the processing unit(s) 1012 with the ROM 1010, the system memory 1004, and the permanent storage device 1002.

From these various memory units, the processing unit(s) 1012 retrieves instructions to execute and data to process in order to execute the processes of the subject disclosure. The processing unit(s) can be a single processor or a multi-core processor in different implementations.

The ROM 1010 stores static data and instructions that are needed by the processing unit(s) 1012 and other modules of the computing system 1000. The permanent storage device 1002, on the other hand, is a read-and-write memory device. This device is a non-volatile memory unit that stores instructions and data even when the computing system 1000 is off. Some implementations of the subject disclosure use a mass-storage device (such as a magnetic or optical disk and its corresponding disk drive) as the permanent storage device 1002.

Other implementations use a removable storage device (such as a floppy disk, flash drive, and its corresponding disk drive) as the permanent storage device 1002. Like the permanent storage device 1002, the system memory 1004 is a read-and-write memory device. However, unlike the storage device 1002, the system memory 1004 is a volatile read-and-write memory, such a random access memory. The system memory 1004 stores some of the instructions and data that the processor needs at runtime. In some implementations, the processes of the subject disclosure are stored in the system memory 1004, the permanent storage device 1002, and/or the ROM 1010. For example, the various memory units include instructions for computer aided pipe string design based on existing string designs in accordance with some implementations. From these various memory units, the processing unit(s) 1012 retrieves instructions to execute and data to process in order to execute the processes of some implementations.

The bus 1008 also connects to the input and output device interfaces 1014 and 1006. The input device interface 1014 enables the user to communicate information and select commands to the computing system 1000. Input devices used with the input device interface 1014 include, for example, alphanumeric, QWERTY, or T9 keyboards, microphones, and pointing devices (also called "cursor control devices"). The output device interfaces 1006 enables, for example, the display of images generated by the computing system 1000. Output devices used with the output device interface 1006 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but is not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 10, the bus 1008 also couples the computing system 1000 to a public or private network (not shown) or combination of networks through a network interface 1016. Such a network may include, for example, a local area network ("LAN"), such as an Intranet, or a wide area network ("WAN"), such as the Internet. Any or all components of the computing system 1000 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, the operations of method 900 of FIG. 9, as described above, may be implemented using the computing system 1000 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs implemented on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of operations in the processes disclosed is an illustration of exemplary approaches. Based upon design preferences, it is understood that the specific order or hierarchy of operations in the processes may be rearranged, or that all illustrated operations be performed. Some of the operations may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the illustrative methods described herein may be implemented by a system including processing circuitry or a computer program product including instructions which, when executed by at least one processor, causes the processor to perform any of the methods described herein.

A computer-implemented method for performing multi-parametric production optimization in fracture-stimulated reservoirs has been described in the present disclosure and may generally include: defining a class of models by combining a simulated fracture geometry comprising a stimulated reservoir volume with accounting for fluid dynamics and phase transitions in the stimulated reservoir volume for modeling production in a plurality of reservoirs associated with the stimulated reservoir volume; generating, based on at least one model from the class of models, an objective function related to the production in the plurality of reservoirs; determining, based on the objective function, one or more parameters related to fracture stages of a fracture network in a reservoir of the plurality of reservoirs; and communicating, via a computer network to a computing device, the determined one or more parameters to be used for at least one of building or operating the fracture network in the reservoir. Further, a computer-readable storage medium having instructions stored therein, which when executed by a computer cause the computer to perform a plurality of functions, including functions to: define a class of models by combining a simulated fracture geometry comprising a stimulated reservoir volume with accounting for fluid dynamics and phase transitions in the stimulated reservoir volume for modeling production in a plurality of reservoirs associated with the stimulated reservoir volume; generate, based on at least one model from the class of models, an objective function related to the production in the plurality of reservoirs; determine, based on the objective function, one or more parameters related to fracture stages of a fracture network in a reservoir of the plurality of reservoirs; and communicate, via a computer network to another computer, the determined one or more parameters to be used for at least one of building or operating the fracture network in the reservoir.

For the foregoing embodiments, the method or functions may include any one of the following operations, alone or in combination with each other: Determining the one or more parameters comprises performing economic analysis of the fracture network for fracture stimulated production in the reservoir; Determining the one or more parameters comprises optimizing the objective function by applying the Quasi Monte Carlo method for choosing a plurality of combinations of the parameters for calculating the objective function during the optimization, and determining the one or more parameters as a combination of the plurality of combinations that maximizes the objective function; Determining the one or more parameters comprises determining, in an iterative manner, a maximum of the objective function by using a constrained optimization method for choosing a plurality of combinations of the parameters, and determining the one or more parameters as a combination of the plurality of combinations that provide the maximum of the objective function.

Each model in the class of models comprises a numerical and mathematical model for fracture stimulated production in the plurality of reservoirs; The one or more parameters comprises at least one of: lengths of fractures associated with the fracture stages of the fracture network, a spacing between each pair of adjacent fractures associated with the fracture stages of the fracture network, or a production time; The lengths of fractures are equal, and the spacing between each pair of adjacent fractures is the same; The simulated fracture geometry comprises planar fractures, parallel to each other, and identical; Each model in the class of models enables phase transition between oil and gas in a condensate reservoir of the plurality of reservoirs.

Likewise, a system for performing multi-parametric production optimization in fracture-stimulated reservoirs has been described and include at least one processor and a memory coupled to the processor having instructions stored therein, which when executed by the processor, cause the processor to perform functions, including functions to: define a class of models by combining a simulated fracture geometry comprising a stimulated reservoir volume with accounting for fluid dynamics and phase transitions in the stimulated reservoir volume for modeling production in a plurality of reservoirs associated with the stimulated reservoir volume; generate, based on at least one model from the class of models, an objective function related to the production in the plurality of reservoirs; determine, based on the objective function, one or more parameters related to fracture stages of a fracture network in a reservoir of the plurality of reservoirs; and communicate, via a computer network to another processor, the determined one or more parameters to be used for at least one of building or operating the fracture network in the reservoir.

For any of the foregoing embodiments, the system may include any one of the following elements, alone or in combination with each other: the functions for determining the one or more parameters performed by the processor include functions to perform economic analysis of the fracture network for fracture stimulated production in the reservoir; the functions for determining the one or more parameters performed by the processor include functions to optimize the objective function by applying the Quasi Monte Carlo method for choosing a plurality of combinations of the parameters for calculating the objective function during the optimization, and determine the one or more parameters as a combination of the plurality of combinations that maximizes the objective function; the functions for determining the one or more parameters performed by the processor include functions to determine, in an iterative manner, a maximum of the objective function by using a constrained optimization method for choosing a plurality of combinations of the parameters, and determine the one or more parameters as a combination of the plurality of combinations that provide the maximum of the objective function.

Prior art methods for economic analysis of production in fracture-stimulated reservoirs typically use analytical and semi-analytical models of production decline in fractured reservoirs. However, these models cannot handle multiphase fluid production, in particular, production from fracture-stimulated reservoirs. Advantages of the present disclosure include, but are not limited to, combining simplified geometry with detailed physical-chemical modeling of matrix diffusion and production processes, which allows for fast and accurate economic analysis of fracture-stimulated production. In addition, the method and apparatus presented in this disclosure can carry out optimization and economic analysis hundreds of times faster than before.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

While specific details about the above embodiments have been described, the above hardware and software descriptions are intended merely as example embodiments and are not intended to limit the structure or implementation of the disclosed embodiments. For instance, although many other internal components of computer system 1000 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the Figures illustrate the architecture, functionality, and operation of possible implementations of systems, methods and computer program products according to various embodiments of the present disclosure. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

What is claimed is:

1. A computer-implemented method for performing multi-parametric production optimization, the method comprising:
    defining a class of models by combining a simulated fracture geometry comprising a stimulated reservoir volume with accounting for fluid dynamics and phase transitions in the stimulated reservoir volume for modeling production in a plurality of reservoirs associated with the stimulated reservoir volume, wherein each model in the class of models is based on mass balance equations for gas condensate and water that enable phase transition analysis between gas and oil in a condensate reservoir;
    generating, based on at least one model from the class of models, an objective function to optimize the production of gas condensate in the plurality of reservoirs, wherein the objective function accounts for a market price of gas condensate;
    determining, based on the objective function, one or more parameters related to fracture stages of a fracture network in a reservoir of the plurality of reservoirs, the one or more parameters being those which optimize the production of gas condensate;
    based upon the determined one or more parameters, projecting revenue for condensate produced from the condensate reservoir; and
    communicating, via a computer network to a computing device, the determined one or more parameters to be used for at least one of building or operating the fracture network.

2. The method of claim 1, wherein each model in the class of models comprises a numerical and mathematical model for fracture stimulated production in the plurality of reservoirs.

3. The method of claim 1, wherein determining the one or more parameters comprises performing economic analysis of the fracture network for fracture stimulated production in the reservoir.

4. The method of claim 1, wherein determining the one or more parameters comprises:
    optimizing the objective function by applying the Quasi Monte Carlo method for choosing a plurality of combinations of the parameters for calculating the objective function during the optimization; and determining the one or more parameters as a combination of the plurality of combinations that maximizes the objective function.

5. The method of claim 1, wherein determining the one or more parameters comprises:

determining, in an iterative manner, a maximum of the objective function by using a constrained optimization method for choosing a plurality of combinations of the parameters; and determining the one or more parameters as a combination of the plurality of combinations that provide the maximum of the objective function.

6. The method of claim 1, wherein the one or more parameters comprises at least one of: lengths of fractures associated with the fracture stages of the fracture network, a spacing between each pair of adjacent fractures associated with the fracture stages of the fracture network, or a production time.

7. The method of claim 6, wherein the lengths of fractures are equal, and the spacing between each pair of adjacent fractures is the same.

8. The method of claim 1, wherein the simulated fracture geometry comprises planar fractures, parallel to each other, and identical.

9. A system for performing multi-parametric production optimization, the system comprising:

at least one processor; and a memory coupled to the processor having instructions stored therein, which when executed by the processor, cause the processor to perform functions, including functions to:

define a class of models by combining a simulated fracture geometry comprising a stimulated reservoir volume with accounting for fluid dynamics and phase transitions in the stimulated reservoir volume for modeling production in a plurality of reservoirs associated with the stimulated reservoir volume, wherein each model in the class of models is based on mass balance equations for gas condensate and water that enable phase transition analysis between gas and oil in a condensate reservoir;

generate, based on at least one model from the class of models, an objective function to optimize the production of gas condensate in the plurality of reservoirs, wherein the objective function accounts for a market price of gas condensate;

determine, based on the objective function, one or more parameters related to fracture stages of a fracture network in a reservoir of the plurality of reservoirs, the one or more parameters being those which optimize the production of gas condensate;

based upon the determined one or more parameters, projecting revenue for gas condensate produced from the condensate reservoir; and communicate, via a computer network to another processor, the determined one or more parameters to be used for at least one of building or operating the fracture network.

10. The system of claim 9, wherein each model in the class of models comprises a numerical and mathematical model for fracture stimulated production in the plurality of reservoirs.

11. The system of claim 9, wherein the functions for determining the one or more parameters performed by the processor include functions to perform economic analysis of the fracture network for fracture stimulated production in the reservoir.

12. The system of claim 9, wherein the functions for determining the one or more parameters performed by the processor include functions to:

optimize the objective function by applying the Quasi Monte Carlo method for choosing a plurality of combinations of the parameters for calculating the objective function during the optimization; and determine the one or more parameters as a combination of the plurality of combinations that maximizes the objective function.

13. The system of claim 9, wherein the functions for determining the one or more parameters performed by the processor include functions to:

determine, in an iterative manner, a maximum of the objective function by using a constrained optimization method for choosing a plurality of combinations of the parameters; and determine the one or more parameters as a combination of the plurality of combinations that provide the maximum of the objective function.

14. The system of claim 9, wherein the one or more parameters comprises at least one of: lengths of fractures associated with the fracture stages of the fracture network, a spacing between each pair of adjacent fractures associated with the fracture stages of the fracture network, or a production time.

15. The system of claim 14, wherein the lengths of fractures are equal, and the spacing between each pair of adjacent fractures is the same.

16. The system of claim 9, wherein the simulated fracture geometry comprises planar fractures, parallel to each other, and identical.

17. A computer-readable storage medium having instructions stored therein, which when executed by a computer cause the computer to perform a plurality of functions, including functions to:

define a class of models by combining a simulated fracture geometry comprising a stimulated reservoir volume with accounting for fluid dynamics and phase transitions in the stimulated reservoir volume for modeling production in a plurality of reservoirs associated with the stimulated reservoir volume, wherein each model in the class of models is based on mass balance equations for gas condensate and water that enable phase transition analysis between gas and oil in a condensate reservoir;

generate, based on at least one model from the class of models, an objective function to optimize the production of gas condensate in the plurality of reservoirs, wherein the objective function accounts for a market price of condensate;

optimize the objective function to determine one or more parameters related to fracture stages of a fracture network in a reservoir of the plurality of reservoirs, the one or more parameters being those which optimize the production of gas condensate;

based upon the determined one or more parameters, projecting revenue for condensate produced from the condensate reservoir; and communicate, via a computer network to another computer, the determined one or more parameters to be used for at least one of building or operating the fracture network.

18. The computer-readable storage medium of claim 17, wherein the instructions further perform functions to:
- determine, in an iterative manner, a maximum of the objective function by using a constrained optimization method for choosing a plurality of combinations of the parameters during the optimization; and
- determine the one or more parameters as a combination of the plurality of combinations that provide the maximum of the objective function.

\* \* \* \* \*